United States Patent [19]
Elliott

[11] Patent Number: 5,521,534
[45] Date of Patent: May 28, 1996

[54] NUMERICALLY CONTROLLED OSCILLATOR FOR GENERATING A DIGITALLY REPRESENTED SINE WAVE OUTPUT SIGNAL

[75] Inventor: Paul M. Elliott, Jenner, Calif.

[73] Assignee: DSC Communications Corporation, Plano, Tex.

[21] Appl. No.: 492,927

[22] Filed: Jun. 21, 1995

[51] Int. Cl.[6] .................................................. H03B 1/00
[52] U.S. Cl. .................... 327/129; 327/107; 327/105; 332/144; 332/145; 364/721; 364/718; 375/373
[58] Field of Search ..................... 327/129, 105–107, 327/114, 117, 233; 332/144, 145, 151; 331/14, 17, 18; 364/718–721; 375/119

[56] References Cited

U.S. PATENT DOCUMENTS

| | | | |
|---|---|---|---|
| 4,241,308 | 12/1980 | Cellier et al. | 327/107 |
| 4,514,696 | 4/1985 | Genrich | 327/114 |
| 4,855,946 | 8/1989 | Ruben et al. | 364/721 |
| 4,905,177 | 2/1990 | Weaver, Jr. et al. | 364/721 |
| 5,084,681 | 1/1992 | Kovalick et al. | 327/106 |
| 5,111,162 | 5/1992 | Hietala et al. | 332/127 |
| 5,142,487 | 8/1992 | Graham, III | 364/721 |
| 5,144,156 | 9/1992 | Kawasaki | 327/157 |
| 5,371,765 | 12/1994 | Guilford | 375/119 |
| 5,399,984 | 3/1995 | Frank | 327/107 |
| 5,448,191 | 9/1995 | Meyer | 327/105 |
| 5,459,680 | 10/1995 | Zimmerman et al. | 364/721 |

Primary Examiner—Timothy P. Callahan
Assistant Examiner—Kenneth B. Wells
Attorney, Agent, or Firm—Baker & Botts

[57] ABSTRACT

A numerically controlled oscillator (10) includes a difference engine (12) that receives a numerator signal (14) and a numerator minus denominator signal (16). The numerator signal (14) and the numerator minus denominator signal (16) represent constant input values for a desired fractional relationship between a sine wave output signal (34) and a sample clock input signal (20) of numerically controlled oscillator (10). The difference engine (12) generates a difference output signal (18) that is received by a phase adder (22) for adding either a one or a zero to a combination of the delta phase input signal (24) and a phase accumulator output signal (26). The difference engine (12) optimally distributes ones and zeros so as to minimize phase jitter in the output signal (34).

8 Claims, 1 Drawing Sheet

NUMERICALLY CONTROLLED OSCILLATOR FOR GENERATING A DIGITALLY REPRESENTED SINE WAVE OUTPUT SIGNAL

TECHNICAL FIELD OF THE INVENTION

The present invention relates in general to frequency processing systems and more particularly to a numerically controlled oscillator.

BACKGROUND OF THE INVENTION

Typical numerically controlled oscillators generate a digitally represented sine wave output signal in response to a delta phase input signal and a sample clock signal. A delta phase input signal is usually added to an output of a phase accumulator and the resulting sum is transferred to the output of the phase accumulator on each sample clock edge. By this process, the phase accumulator output increases uniformly each sample clock cycle until the adder overflows beginning a new cycle.

The phase accumulator output value can be seen as representing the instantaneous phase of the output signal. Through appropriate selection of the delta phase input signal, the output frequency of the phase accumulator can be controlled over a wide range in a manner completely synchronous with the sample clock. By selecting the phase accumulator bit width, the frequency and phase resolution of the numerically controlled oscillator can be determined. In this manner, the output frequency has a binary relationship to the sample clock signal, ranging from zero Hertz to one-half the sample clock frequency in steps dictated by the bit width of the delta phase accumulator.

Numerically controlled oscillators may also be designed such that the output signals have a decimal fraction relationship to the sample clock signal by using binary coded decimal arithmetic in the phase adder. However, these binary and binary coded decimal numerically controlled oscillators are limited to use certain frequency relationships. In order to attempt other fractional relationships, typical numerically controlled oscillators use a sufficient number of bits in the phase accumulator width to produce a frequency error that is acceptably small for a desired application. In certain applications, however, any frequency error will eventually cause improper system operation. Therefore, it is desirable to have a numerically controlled oscillator that can generate a precise frequency relationship when required.

From the foregoing, it may be appreciated that a need has arisen for a numerically controlled oscillator that can generate a desired fractional relationship between an output and a sample clock input. A need has also arisen for a numerically controlled oscillator that is less dependent on bit width in order to obtain the desired fractional relationship.

SUMMARY OF THE INVENTION

In accordance with the present invention, a numerically controlled oscillator is provided that substantially eliminates or reduces disadvantages and problems associated with conventional numerically controlled oscillators.

According to an embodiment of the present invention, there is provided a numerically controlled oscillator that includes a phase adder operable to receive a phase input signal. The output of the phase adder is received by a phase accumulator that latches the phase adder output and generates a phase accumulator output in response to a sample clock signal. The phase adder combines the phase accumulator output with the phase input signal to generate the phase adder output. A difference engine generates an adjustment output in response to the sample clock signal. The phase adder combines the adjustment output with the phase input signal such that the phase accumulator output has a desired fractional relationship to the sample clock signal.

The present invention provides various technical advantages over existing numerically controlled oscillator devices. For example, one technical advantage is in using a difference engine to generate a desired fractional relationship between the phase accumulator output and the sample clock signal. Another technical advantage is in minimizing phase jitter on the phase accumulator output. Yet another technical advantage is in effectively extending a bit width of the phase accumulator. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
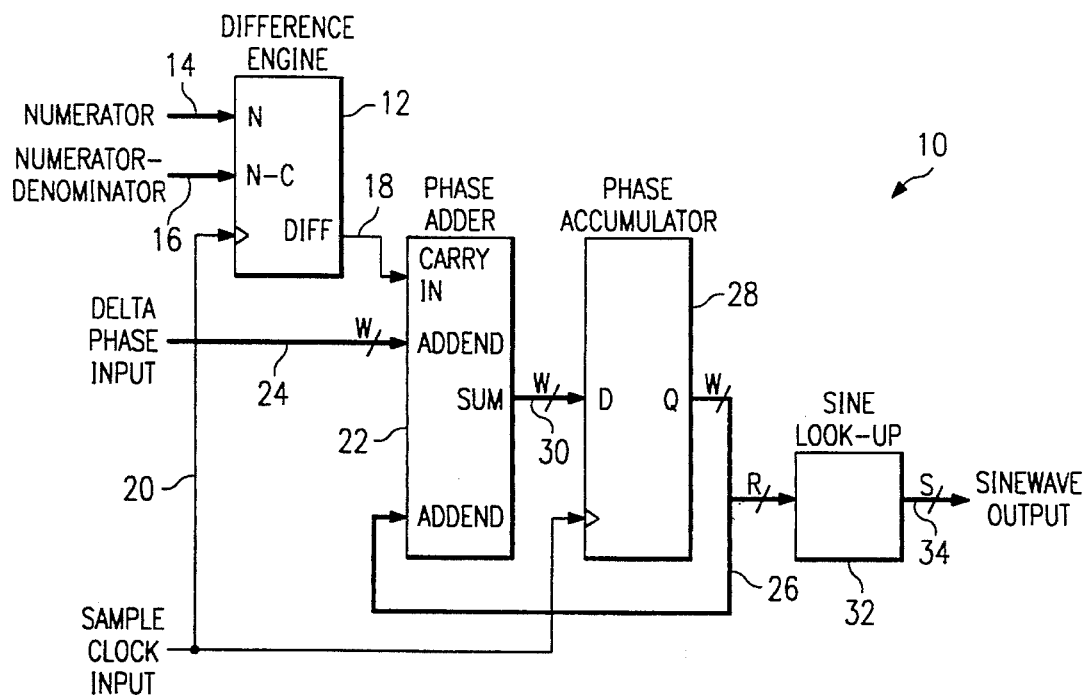
FIG. 1 illustrates a block diagram of a numerically controlled oscillator.

FIG. 1 is a block diagram of a numerically controlled oscillator 10. Numerically controlled oscillator 10 includes a difference engine 12 that receives a numerator signal 14 and a numerator minus denominator signal 16. Difference engine 12 generates a difference signal 18 in response to a sample clock input signal 20. A phase adder 22 receives difference signal 18 from difference engine 12 and a delta phase input signal 24. Phase adder 22 also receives a phase accumulator output signal 26 from a phase accumulator 28. Phase adder 22 combines difference signal 18, delta phase input signal 24, and phase accumulator output signal 28 in order to generate a phase adder output signal 30. Phase accumulator 28 latches phase adder output signal 30 in response to sample clock input signal 20. Phase accumulator output signal 26 is provided to a sine lookup table 32 in order to generate a sine wave output 34. Though shown as having a sine wave output signal 34, numerically controlled oscillator 10 may use other output functions instead of the sine wave lookup technique.

In operation, phase adder 22 adds the delta phase input signal 24 to the phase accumulator output signal 26. The resulting sum is transferred to phase accumulator 28 upon each pulse of sample clock input signal 20. Phase adder 22 also adds in the difference signal 18 generated by difference engine 12 via the carry in port of phase adder 22. Difference engine 12 performs the function of adding either a one or a zero to the input of phase adder 22. The ratio of added ones and zeros is determined by a numerator and denominator for a desired fractional relationship between phase accumulator output signal 26 and sample clock input signal 20. Difference engine 12 optimally distributes these ones and zeros so as to minimize phase jitter.

In most numerically controlled oscillator architectures, the desired output signal must be able to be represented as a binary fraction of the input clock frequency. The typical equation describing the output frequency is $$F_0 = F_c \cdot \frac{A}{2^w} \qquad (1)$$

where, $F_0$ is the output frequency;
$F_c$ is the input clock frequency;
A is the integer numerator; and
$2^w$ is the power of 2 denominator, with w being the number of bits used in the phase accumulator. Such an equation provides merely a binary relationship between the output signal and the input clock signal of the numerically controlled oscillator. The use of difference engine 12 provides the ability to have any desired relationship between the output signal 34 and the sample clock input signal 20 of numerically controlled oscillator 10. The relationship can be expressed by the following equation:

$$F_0 = F_c \cdot (A + n/d)/2^w \qquad (2)$$

where, $F_0$ is the output frequency;
$F_c$ is the input clock frequency;
A is an integer numerator;
$2^w$ is power of 2 denominator, with w being the number of bits used in phase accumulator 28; and
n/d represents the arbitrary fraction of a numerator and a denominator with a value less than one. The term n/d is represented in this design by the long term average of a series of sequential ones and zeros.

As an example, to obtain a desired fractional relationship of 1/10 for an eight bit phase accumulator 28, the fraction 1/10 can be represented within Equation (2) as 25+3/5)/256. Such a relationship and any other desired relationship can be implemented within numerically controlled oscillator 10 through difference engine 12.

In the example above, the value 26 would repeat for three samples and 25 for two samples, yielding the average numerator value of 25+3/5. In practice, the alternation of the values 25 and 26 would be controlled to produce the minimum amount of absolute deviation from the desired ratio. The series 25, 26, 26, 25, 26, . . . has less peak deviation from the mean than the series 25, 25, 26, 26, 26, . . . . While the variation over time of the NCO numerator can cause additional phase jitter in the output signal as compared to the phase jitter with a fixed numerator, this jitter can be reduced to an arbitrarily small value by increasing the number of bits in the NCO phase accumulator. The number of bits used in the phase adder and accumulator of the NCO may be reduced to equal the number of bits driving the sine look-up function with no loss in signal purity.

Figure 2:
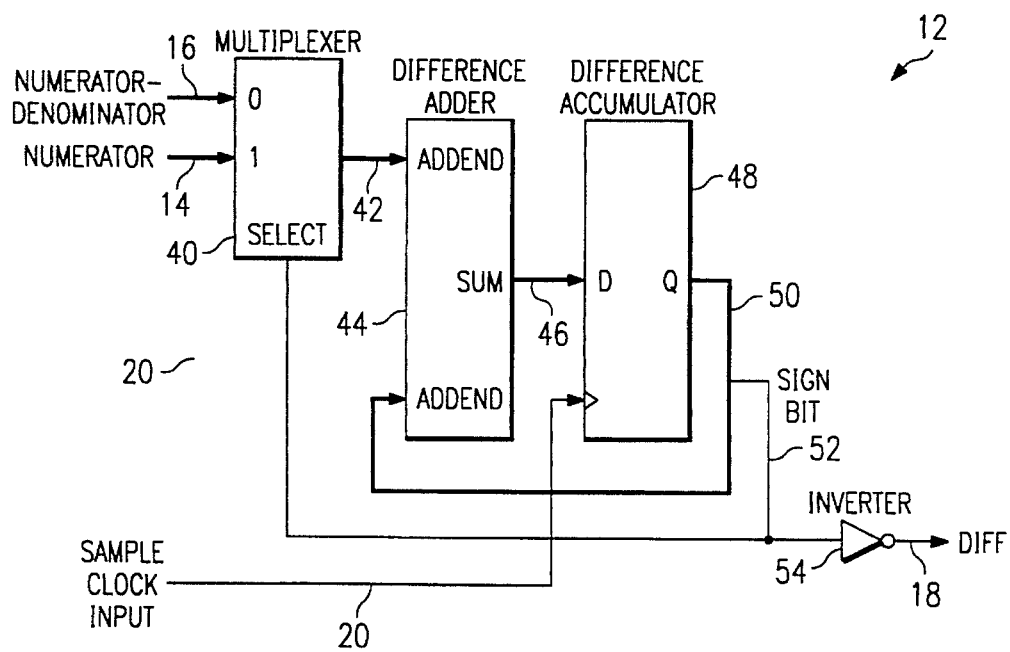
FIG. 2 illustrates a block diagram of a difference engine within the numerically controlled oscillator.

FIG. 2 is a block diagram of difference engine 12. Difference engine 12 includes a multiplexer 40 that receives numerator signal 14 and numerator minus denominator signal 16. Multiplexer 40 generates a multiplexer output signal 42 that is received at a difference adder 44. Difference adder 44 generates a difference adder sum signal 46 that is received by a difference accumulator 48. Difference accumulator 48 generates a difference accumulator output signal 50 that is combined with multiplexer output signal 42 by difference adder 44. Difference accumulator output signal 50 includes a sign bit signal 52 that is used to select one of numerator signal 14 and numerator minus denominator signal 16 at multiplexer 40. Sign bit signal 52 is fed through an inverter 54 to generate difference signal 18 for output from difference engine 12. Multiplexer 40 accepts the input constant values of numerator signal 14 and numerator minus denominator signal 16 that represent the numerator of the desired arbitrary fraction and a value equal to the numerator minus the denominator for the desired arbitrary fraction respectively. The value of numerator minus denominator is a negative number, allowing a simple adder to perform the operations of both addition and subtraction.

In operation, difference engine 12 performs the following operation in every cycle of sample clock input signal 20. If the current value of difference accumulator output signal 50 is negative, the value of numerator signal 14 is added to difference accumulator output signal 50. If difference accumulator output signal 50 is positive, the numerator minus denominator signal 16 is added (i.e., subtracted) from the value of difference accumulator output signal 50. Subtraction of the value denominator minus numerator is accomplished by adding the value of the numerator minus denominator signal 16. Difference output signal 18 is the inverted sign bit from difference accumulator output signal 50 of difference accumulator 48. For every value of denominator clock cycles, difference output signal 18 will have a logic one level for a number of times equivalent to the value of the numerator. Difference output signal 18 will provide the variation between logic level one and logic level zero to produce the desired alternation in such a manner that generates the minimum amount of phase jitter in sine wave output signal 34 of numerically controlled oscillator 10.

In summary, a numerically controlled oscillator uses a difference engine in order to establish any desired relationship between an output of the numerically controlled oscillator and a sample clock input to the numerically controlled oscillator. The difference engine performs the function of adding either a one or a zero to a phase adder. The ratio of adder ones to zeros is determined by the numerator and denominator of the desired arbitrary fractional relationship. The difference engine is designed to optimally distribute these ones and zeros so as to minimize phase jitter in the output signal.

Thus, it is apparent that there has been provided, in accordance with the present invention, a numerically controlled oscillator that satisfies the advantages set forth above. Although the preferred embodiment has been described in detail, it should be understood that various substitutions, changes, and alterations can be made herein without departing from the spirit and scope of the present invention as defined by the following claims.

What is claimed is:

1. A numerically controlled oscillator, comprising:
   a phase adder operable to receive a delta phase input signal;
   a phase accumulator operable to receive a phase adder output from said phase adder, said phase accumulator operable to latch said phase adder output and generate a phase accumulator output in response to a sample clock signal, said phase adder combining said phase accumulator output with said delta phase input signal to generate said phase adder output;
   a difference engine operable to generate an adjustment output in response to said sample clock signal, said phase adder combining said adjustment output with said delta phase input signal such that said phase accumulator output has a desired fractional relationship to said sample clock signal.

2. The numerically controlled oscillator of claim 1, wherein said adjustment output provides a representation of said desired fractional relationship between said phase accumulator output and said sample clock signal.

3. The numerically controlled oscillator of claim 1, wherein said adjustment output is a series of binary ones and zeros, said difference engine optimally distributing said binary ones and zeros to minimize phase jitter on said phase accumulator output.

4. The numerically controlled oscillator of claim 3, wherein said adjustment output has a binary one value for each integer value of a numerator of said desired fractional relationship.

5. The numerically controlled oscillator of claim 1, wherein said difference engine receives a first and a second input representing said desired fractional relationship.

6. The numerically controlled oscillator of claim 5, wherein said difference engine includes:

- a multiplexer operable to receive said first and second inputs, said multiplexer operable to select one of said first and second inputs for a multiplexer output;
- a difference adder operable to receive said multiplexer output from said multiplexer;
- a difference accumulator operable to receive a difference adder output from said difference adder, said difference accumulator operable to latch said difference adder output and generate a difference accumulator output in response to said sample clock signal, said difference adder operable to combine said difference accumulator output with said multiplexer output to generate said difference adder output, said difference accumulator output having a sign bit representing said adjustment output.

7. The numerically controlled oscillator of claim 6, wherein said sign bit is operable to select one of said first and second inputs for said multiplexer output.

8. The numerically controlled oscillator of claim 6, wherein said first input represents a numerator of said desired fractional relationship, said second input representing a difference between said numerator and a denominator of said desired fractional relationship.

* * * * *